(12) United States Patent
Li et al.

(45) Date of Patent: Aug. 10, 2021
(10) Patent No.: US 11,088,780 B2

(54) LOW COMPLEXITY BLIND DETECTION OF CODE RATE

(71) Applicant: Huawei Technologies Co., Ltd., Shenzhen (CN)

(72) Inventors: Bin Li, Shenzhen (CN); Aaron James Callard, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/448,853

(22) Filed: Jun. 21, 2019

(65) Prior Publication Data

US 2019/0379484 A1 Dec. 12, 2019

Related U.S. Application Data

(63) Continuation of application No. PCT/CN2016/111935, filed on Dec. 24, 2016.

(51) Int. Cl.
*H04L 1/00* (2006.01)
*H03M 13/13* (2006.01)
*H04L 5/00* (2006.01)

(52) U.S. Cl.
CPC .......... *H04L 1/0038* (2013.01); *H03M 13/13* (2013.01); *H04L 1/0026* (2013.01); *H04L 1/0057* (2013.01); *H04L 5/006* (2013.01)

(58) Field of Classification Search
CPC ... H04L 1/0038; H04L 1/0026; H04L 1/0057; H04L 5/006; H04L 1/20; H04L 1/00; H04L 1/0046; H03M 13/13

USPC .......................................................... 714/748
See application file for complete search history.

(56) References Cited

U.S. PATENT DOCUMENTS

| | | | | |
|---|---|---|---|---|
| 6,438,121 | B1* | 8/2002 | Hammons, Jr. ........ | H04L 1/0054 370/345 |
| 7,167,502 | B1* | 1/2007 | Tsaur .................. | H04J 13/0044 370/320 |
| 9,504,028 | B2* | 11/2016 | Pan ...................... | H04W 48/12 |
| 2011/0038266 | A1* | 2/2011 | Kim ..................... | H04W 24/08 370/242 |
| 2011/0317615 | A1* | 12/2011 | Soong ................... | H04W 4/12 370/315 |
| 2013/0094605 | A1* | 4/2013 | Larsson .............. | H03M 13/356 375/295 |

(Continued)

FOREIGN PATENT DOCUMENTS

| | | |
|---|---|---|
| CN | 101557254 A | 10/2009 |
| CN | 102170649 A | 8/2011 |

(Continued)

*Primary Examiner* — James C Kerveros
(74) *Attorney, Agent, or Firm* — Slater Matsil, LLP (57) ABSTRACT

Blind detection of code rates for codes with incremental shortening involves determining a decoding code rate for decoding words that are based on codewords of a code that exhibits incremental shortening over a range of code rates. Incremental shortening is a code structure or coding property according to which different numbers of bits in encoding blocks that are to be encoded are set or frozen to a fixed value, to provide the range of code rates. This property enables blind detection of a decoding code rate, without explicit signaling or prior configuration of code rates between a transmitter and a receiver.

27 Claims, 7 Drawing Sheets

$$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix} \quad G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

(56) References Cited

U.S. PATENT DOCUMENTS

| | | | |
|---|---|---|---|
| 2014/0153452 A1* | 6/2014 | Son | H04L 5/001 370/280 |
| 2014/0254455 A1* | 9/2014 | Nikopour | H04W 72/1273 370/312 |
| 2014/0307569 A1* | 10/2014 | Barbieri | H04J 11/0043 370/252 |
| 2015/0117354 A1* | 4/2015 | Dai | H04W 72/042 370/329 |
| 2018/0167164 A1* | 6/2018 | Lin | H04L 1/00 |
| 2020/0112395 A1* | 4/2020 | Carsello | H04L 1/0046 |

FOREIGN PATENT DOCUMENTS

| | | |
|---|---|---|
| CN | 103701564 A | 4/2014 |
| WO | 2014135122 A1 | 9/2014 |

\* cited by examiner $$G_2 = \begin{bmatrix} 1 & 0 \\ 1 & 1 \end{bmatrix} \quad G_2^{\otimes 2} = \begin{bmatrix} G_2 & 0 \\ G_2 & G_2 \end{bmatrix}$$

100 →

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

102 →

$$G_2^{\otimes 3} = \begin{bmatrix} 0 & 0 & 0 & G_2 \\ 0 & 0 & G_2 & G_2 \\ 0 & G_2 & 0 & G_2 \\ G_2 & G_2 & G_2 & G_2 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix}$$

LOW COMPLEXITY BLIND DETECTION OF CODE RATE

CROSS-REFERENCE TO RELATED APPLICATIONS

This application is a continuation of PCT Application No. PCT/CN2016/111935, filed on Dec. 24, 2016, which application is hereby incorporated herein by reference in its entirety.

TECHNICAL FIELD

The present disclosure relates to generally to communications and, in particular, to blind detection of code rates for decoding received coded information.

BACKGROUND

In at least some communication scenarios, it may be beneficial to not have dedicated signaling transmit a code rate for a particular block of information that is transmitted to a receiver. In grant free transmission or connectionless transmission scenarios, for example, a User Equipment (UE) will transmit data over a random access channel or other communication resources without first receiving a grant of permission to use those communication resources. A receiver such as an evolved Node B (eNB) could use many different Modulation and Coding Schemes (MCSs) in an attempt to decode received information, or the transmitter and receiver could limit communications to only a particular MCS.

SUMMARY

Incremental shortening relates to a code structure or coding property of certain types of codes, such as polar codes and Low Density Parity Check (LDPC) codes, for example. With incremental shortening, different code rates are at least partially built by freezing different numbers of bits in an encoding block that is to be encoded. An encoding block with fewer information bits frozen corresponds to a higher coding rate than the same size encoding block with more information bits frozen. A code is incrementally shortened if a bit that is frozen for a particular code rate will be frozen to the same value for lower code rates.

According to one aspect of the present disclosure, a word that is based on a codeword of a code is received. The code has this incremental shortening property over a range of code rates. The incremental shortening property enables blind detection of a code rate within the range of code rates, to be used in decoding the received word. The received word is decoded using the blindly detected code rate. The word may be received by a receiver of a communication device such as UE or a network element in a communication network, and decoded by a decoder that performs blind detection of the code rate for decoding.

At a transmitting device, which could similarly be a UE or a network element, an encoding rate is selected from a range of code rates. The encoding rate is selected for encoding information using a code which has the incremental shortening property over the range of code rates. The information is encoded using the code and the selected encoding code rate, and transmitted without explicit signaling of the selected encoding code rate for blind detection of a decoding code rate at a receiver for decoding the encoded information.

In addition to method and apparatus implementations, other embodiments are also contemplated. For example, a non-transitory processor-readable medium could be used to store instructions which, when executed by one or more processors, cause the one or more processors to perform a method as disclosed herein.

Other aspects and features of embodiments of the present disclosure will become apparent to those ordinarily skilled in the art upon review of the following description.

BRIEF DESCRIPTION OF THE DRAWINGS

Examples of embodiments of the invention will now be described in greater detail with reference to the accompanying drawings.

DETAILED DESCRIPTION

As noted above, a receiver of a grant free transmission could use many different MCSs in an attempt to decode received information, or a transmitter and receiver could limit communications to only a particular MCS. Limiting to a particular MCS may simplify decoding and reduce decoding latency, but precludes MCS adaptation between the transmitter and receiver. However, there are several reasons why MCS adaptation may be useful in grant free transmission and possibly other communication scenarios.

For example, with a fixed MCS the total transport block size (TBS) is fixed, presuming a fixed resource size. This is inefficient if a transmitter has significantly less data to send than the fixed transport block size. For instance, if the TBS is 1000 bits but the transmitter only has 400 bits to send, then the transmitter would append values to the end of its data, by zero padding for example, to make up the 600-bit difference. With MCS adaptation, the amount of zero padding can be reduced, by adapting the TBS to more closely fit the amount of data that is to be transmitted. This may also improve reception performance. An MCS with a smaller TBS tends to require a lower Signal to Noise Ratio (SNR) for successful decoding, and therefore could be successfully decoded more often than an MCS with a larger TBS. In this sense, MCS adaptation could provide better performance over the air.

Thus, in a fixed MCS scenario, the fixed size transport block is filled out with zero padding, whereas MCS adaptation could be used to change the MCS and thus vary the size of the transport block to more closely match payload size. MCS adaptation could similarly be used to increase the amount of payload data that can be sent in a transport block if the payload size is larger than the transport block size associated with a particular fixed MCS.

Another scenario where blind detection of MCS is applicable is on a control channel such as Physical Downlink Control Channel (PDCCH). In this environment a UE could decode several different combinations of resources, and code rates. The application of blind code rate detection as disclosed herein could reduce the time and processing cost of such blind decoding.

Embodiments disclosed herein exploit a code structure or coding property of certain types of codes, such as polar codes and Low Density Parity Check (LDPC) codes, for example, to enable blind detection of a code rate for decoding by a receiver. Such blind detection of code rate in turn provides for MCS adaptation in grant free or connectionless transmission, without prior configuration of code rate or explicitly signaling code rate or MCS from a transmitter to a receiver. Although embodiments are described herein primarily in the context of polar codes, embodiments are not restricted only to polar codes. Polar codes represent an illustrative and non-limiting example.

This code structure or coding property is referred to herein as incrementally shortened. An incrementally shortened Forward Error Correction (FEC) code has the property that different code rates are at least partially built by fixing or "freezing" overlapping sets of information bits. A higher code rate has fewer information bits frozen, while a lower code rate has more information bits frozen. Freezing information bits is intended to convey the notion that a transmitter and receiver agree upon a predefined value for the particular frozen information bits. A code is incrementally shortened if, as more and more bits are frozen, the choice of which bits to freeze and the values to which to freeze those bits are made in an incremental fashion, such that if a bit is frozen for a particular code rate r1, then that same bit will be frozen to the same value for code rates r2<r1.

Codes may only have this coding property over limited ranges of code rate. Embodiments of the present disclosure can still be applied over those limited ranges of code rate.

Polar codes are proposed as new channel codes for wireless communications. These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Cyclic Redundancy Check (CRC)-aided list decoding is one option for decoding polar coded information.

Figure 1:
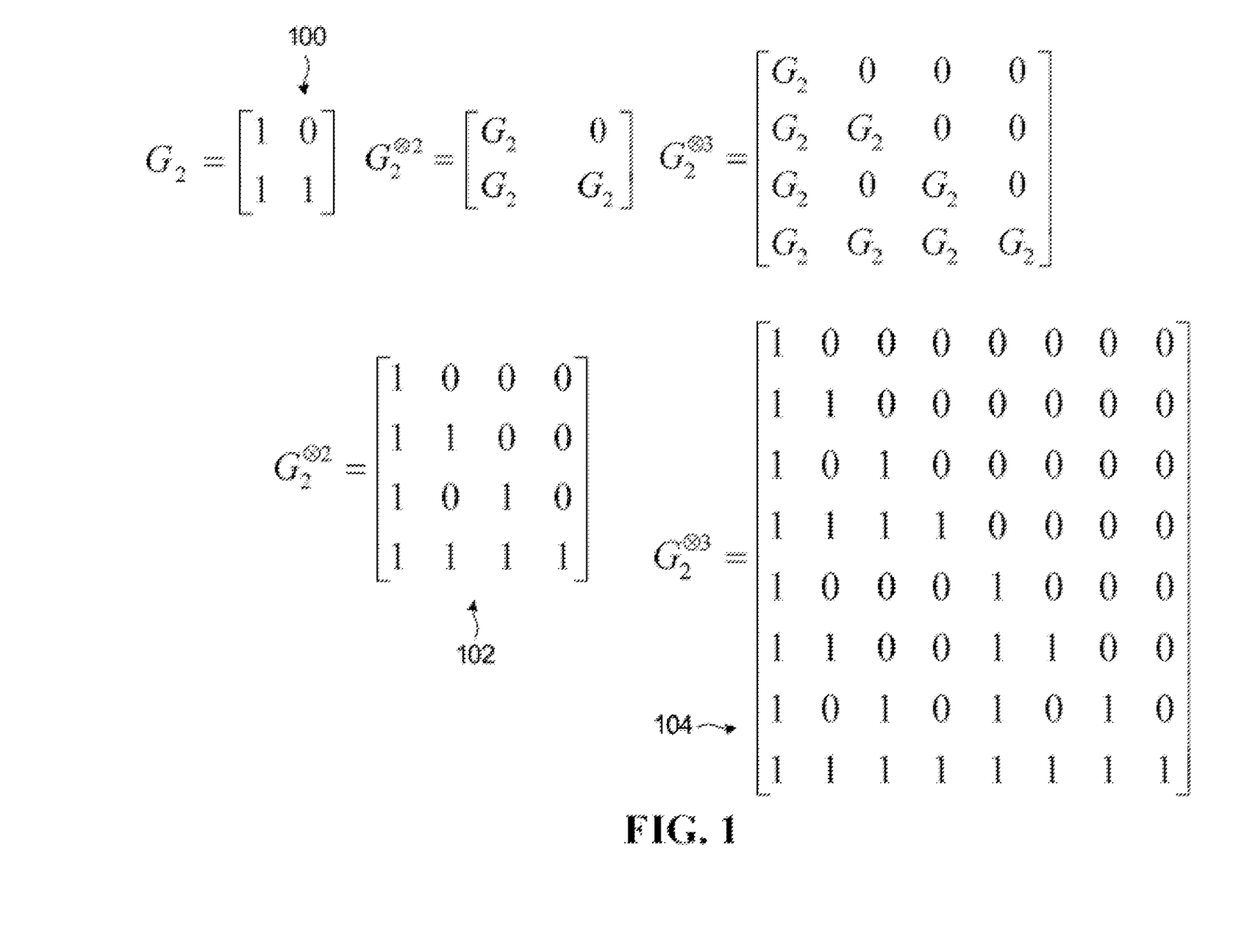
FIG. 1 is a diagram showing how a polar coding generator matrix can be produced from a kernel.

FIG. 1 is a diagram showing how a polar coding generator matrix can be produced from a kernel $G_2$ 100. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figure 2:
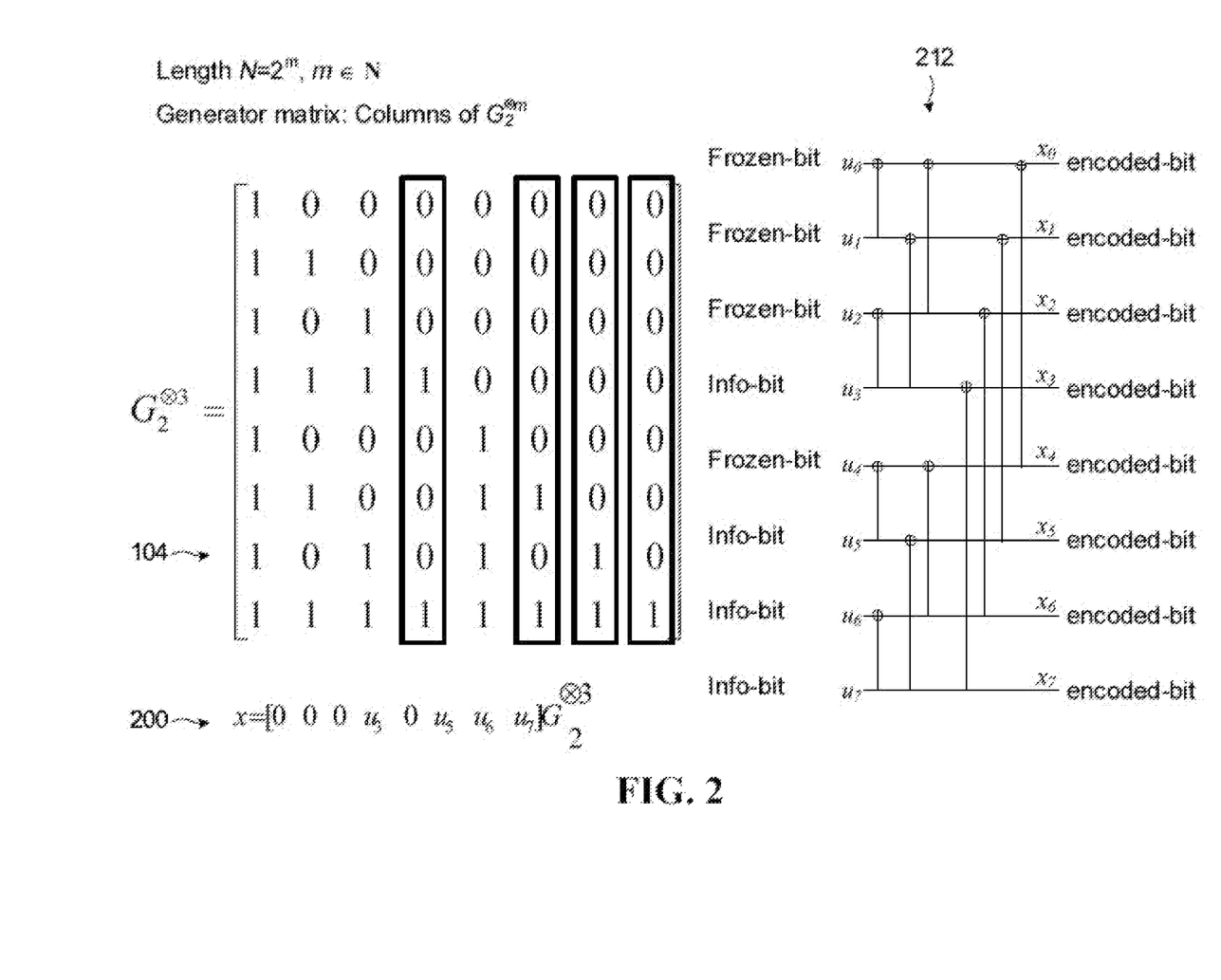
FIG. 2 is a diagram showing an example use of a polar coding generator matrix for producing codewords and a schematic illustration of an example polar encoder.

A polar code can be formed from a Kronecker product matrix based on matrix $G_2$ 100. For a polar code having codewords of length $N=2^m$, the generator matrix is $G_2^{\otimes m}$. FIG. 2 is a diagram showing an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector u=[0 0 0 $u_3$ 0 $u_5$ $u_6$ $u_7$] and the generator matrix $G_2^{\otimes 3}$ 104 as indicated at 200. The input vector u is composed of information bits and fixed or frozen bits. In the specific example shown in FIG. 2, N=8, so the input vector u is an 8-bit vector, and the codeword x is an 8-bit vector. The input vector has frozen bits in positions 0,1,2 and 4, and has information bits at positions 3,5,6, and 7. An example implementation of a coder that generates codewords is indicated at 212, where the frozen bits are all set to o, and the circled "+" symbols represent modulo 2 addition. For the example of FIG. 2, an N=8-bit input vector is formed from K=$_4$ information bits and N-K=4 frozen bits. Codes of this form are referred to as polar codes and the encoder is referred to as a polar encoder. Decoders for decoding polar codes are referred to as polar decoders.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate of the physical channel. The reliability sequence (reliable and unreliable positions) may be calculated based on characteristics of the physical channel before the information is transmitted over the channel. In theory, the frozen bits can be set to any value so long as the location of the frozen bits is known to both the encoder and the decoder. In conventional applications, the frozen bits are all set to zero.

Error-detecting code (EDC) bits can be included in the input vector to assist in decoding. A cyclic redundancy check (CRC) code could be used as an EDC. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in the more reliable positions in the input vector, although CRC bits may also be placed in other positions in the input vector. CRC bits may also be used in path selection for List decoding, for example, to improve polar code performance. During encoding, an N-bit input vector is formed from K information bits, a u-bit CRC, and (N-K-u) frozen bits. Starting with K information bits, a u-bit CRC is calculated and appended to the K information bits to produce a set of input bits including the K information bits and the u-bit CRC. The (N-K-u) frozen bits are inserted to produce an N-bit input vector, where N is a power of 2. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits and the CRC bits are unknown bits. A characteristic of some polar decoders is that the unknown bits are decoded sequentially, for example the polar decoding algorithm may be based on successive cancellation (SC). Once a particular decision has been made regarding how an unknown bit is to be decoded, SC polar decoders do not allow that bit to be changed or corrected, and the decoder moves on to decoding the next unknown bit. Another type of polar decoding algorithm with greater space efficiency, referred to as a List decoder, is described in "List Decoding of Polar Codes" by Tal and Vardy, *Proceedings of the* 2011 *IEEE International Symposium on Information Theory*, pp. 1-5 (July 2011). In a List decoder, successive levels of a binary decision tree are generated, each level corresponding to a decision on a respective unknown bit. Each path in the decision tree from the root node to leaf nodes represents a possible partial decoded sequence of unknown bits and has a corresponding likelihood. During generation of the decision tree, at each level of the decision tree where the number of paths grows beyond a set threshold L, the L paths having the highest likelihood are identified, and the remaining paths are discarded. If the codeword includes encoded CRC bits for the previous information bits, once the decision tree is generated, each of the surviving paths that correspond to the decoded information bits is checked against the CRC bits represented in each of the surviving paths. The decoder then outputs as a decoded vector the information bits in the surviving path that passes the CRC check. If more than one path passes the CRC check, the decoder selects for output the path that passes the CRC check and has the highest likelihood, which may be determined according to a metric. If no path passes the CRC check, or if the codeword does not include encoded CRC bits, the decoder selects for output the path that has the highest likelihood, which as noted above may be determined according to a metric.

Thus, there are two types of the decoding based on successive cancellation, including SC decoding and List decoding. List decoding can be further divided into CRC-aided list decoding as described herein, and pure List decoding in which survivor paths with the highest likelihood are selected. SC decoding is a special case of pure list decoding, with list size L=1.

Figure 3:
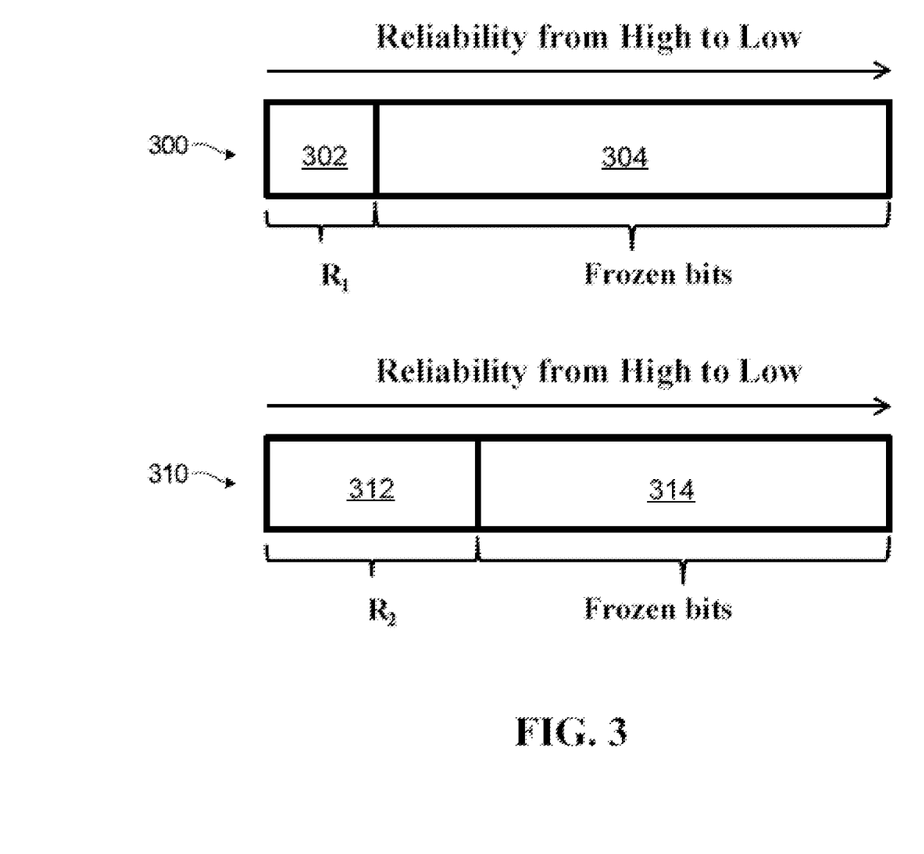
FIGS. 3 and 4 are block diagrams illustrating encoding bits to be encoded by a polar code.
Figure 4:
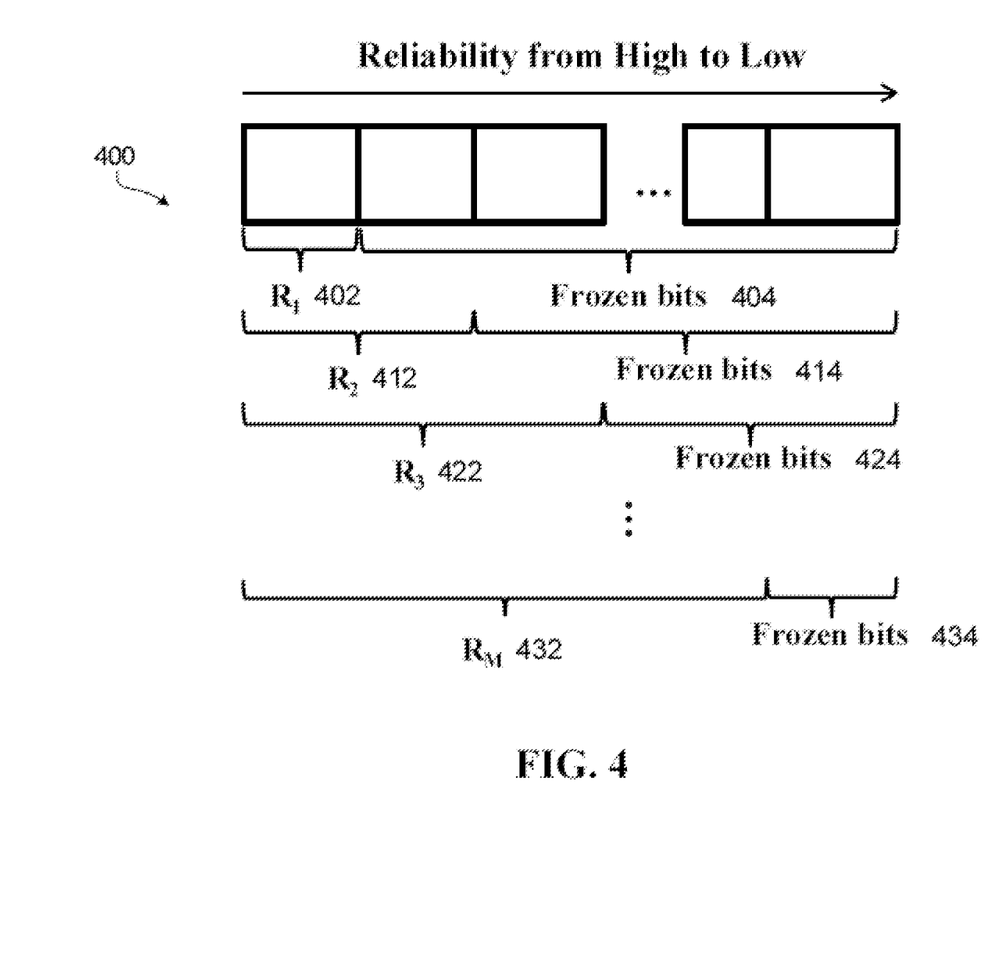

FIGS. 3 and 4 are block diagrams illustrating encoding bits to be encoded by a polar code. With reference first to FIG. 3, a block of encoding bits 300 includes information bits 302 and one or more frozen bits 304. A block of encoding bits 310 similarly includes information bits 312 and one or more frozen bits 314. In the block 300, the information bit block $R_1$ at 302 is shorter than the information bit block $R_2$ at 312. The blocks 300, 310 have the same total length, and therefore the block 300 includes more frozen bits 304 than the block 310. With a longer information bit block $R_2$ at 312, the block 310 has a higher associated code rate than the block 300. The blocks 300, 310 represent blocks $R_1$, $R_2$ of information bits and different numbers of frozen bits that are input to an encoder for encoding. Encoded outputs from the encoder are codewords of a code.

This is also shown more generally in FIG. 4, which illustrates different length information bit blocks $R_1$, $R_2$, $R_3$, . . . $R_M$ at 402, 412, 422, 432, each associated with a respective different code rate. The total length of a block 400 of encoding bits is the same for each of the information bit blocks $R_1$, $R_2$, $R_3$, . . . $R_M$, and therefore the number of frozen bits 404, 414, 424, 434 varies depending on information bit block length.

Embodiments of the present disclosure are applicable to codes that exhibit incremental shortening, in which a shorter block of information bits, which would have a lower effective code rate when encoded, includes a subset of the information bits in a longer block of information bits, which would have a higher effective code rate. "Subset" herein denotes a subset in terms of information bits. In FIG. 3, for example, the block $R_1$ is shorter than the block $R_2$. The information bits of the block $R_1$ correspond to the first information bits of the block $R_2$. In this sense, the $R_1$ block is a subset of the $R_2$ block, or the $R_1$ information bits are a subset of the $R_2$ information bits. If the block $R_1$ has a length $l_1$ for instance, then the block $R_1$ includes the first $l_1$ information bits of the block $R_2$, followed by frozen bits. More generally, with reference to FIG. 4, an information bit block $R_m$ is a subset of a longer/higher code rate information bit block $R_{m+1}$.

Other FEC codes also have this coding property. Any code which uses 'shortening' as a rate matching scheme, for example, could also be said to have this property, as long as the shortening is performed incrementally, over the same increasing set of bits. Examples of such shortening applied to LDPC codes can be found in T. Tian and C. R. Jones, "Construction of Rate-Compatible LDPC Codes Utilizing Information Shortening and Parity Puncturing", EURASIP Journal on Wireless Communications and Networking, 2005-5, pages 789-795, and when applied to Turbo Codes in D. Feng et al. "Rate-Compatible Shortened Turbo Product Codes", 2006 IEEE 63rd Vehicular Technology Conference, 2006, Volume: 5, pages 2489-2493.

Figure 5:
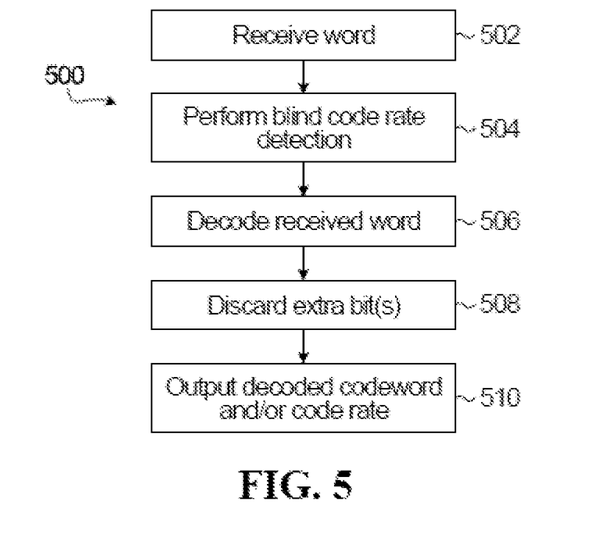
FIG. 5 is a flow diagram of an example blind code rate detection and decoding method according to an embodiment.

FIG. 5 is a flow diagram of an example blind code rate detection and decoding method according to an embodiment. The method 500 involves receiving, at 502, a word that is based on a codeword of a code. The code has an incrementally shortened property over a range of code rates. Each block of information bits that is associated with encoding at a code rate below a maximum code rate within the range of code rates includes a subset of information bits in a block of information bits that is associated with encoding at a higher code rate within the range of code rates. As shown in FIG. 4, for example, for each code rate below the maximum code rate associated with block $R_M$, the blocks $R_1$, $R_2$, $R_3$, . . . , $R_{M-1}$, include subsets of the information bits of the information bit blocks that are associated with a next higher code rate. An information bit block associated with a code rate below the maximum code rate, within the range of code rates across which incremental shortening is exhibited, is therefore a subset of an information bit block associated with the next higher code rate in the range, as disclosed herein.

Blind detection of a code rate that is to be used in decoding the received word is performed at 504, and the received word is decoded at 506 using the blindly detected code rate. The decoded word may include an information bit block followed by one or more extra bits, such as the frozen bits shown in FIGS. 3 and 4. The extra bit(s) could be discarded at 508. At 510, the decoded codeword, an indication of the blindly detected code rate, and/or an indication of the code rate corresponding to the decoded information bit block could be output to one or more receiver components.

The blind detection at 504 does not rely on prior configuration of code rate or any explicit signaling of code rate from a transmitter of the received word. Blind decoding is therefore independent of prior configuration or explicit signaling of a code rate for decoding. This may be useful in supporting MCS adaptation without requiring extra signaling to configure or convey a code rate that should be used for decoding.

In an embodiment, blind detection is based on communication channel conditions. For example, referring again to FIG. 4, bit reliability in a polar code decreases as the code rate or the number of information bits in an encoding bit block increases. Therefore, to decode the information bit block $R_1$, at 402, a minimum received SNR>=$SNR_1$ might be required. Decoding the longer information bit block $R_2$ at

412 may then require SNR>=$SNR_2$, with $SNR_2$>$SNR_1$. A receiver could determine SNR either specifically for blind code rate detection or for other purposes as well, and determine a code rate for decoding based on the determined SNR. Determining SNR could involve, for example, measuring or estimating SNR. If the determined SNR>=$SNR_2$, then decoding using a code rate associated with $R_2$, should successfully decode either $R_2$ or $R_1$. Even if the received word was encoded with the lower code rate associated with $R_1$, then with the code property describe herein a decoder can still decode $R_1$ with one or more extra frozen bits, which are zeros in an embodiment. The extra frozen bit(s) could be discarded at 508 before outputting $R_1$ at 510 in this example.

More generally, referring again to the example in FIG. 4, if SNR>=$SNR_m$, with m=1, 2, . . . , M, then it should be possible to successfully decode $R_p$ (p<=m), with one or more extra frozen bits in the case of using rate-mismatching decoding at a higher code rate than the code rate associated with $R_p$, when p<m. The blindly detected code rate may therefore be the code rate that was used in encoding by a transmitter, or a different code rate associated with a longest information bit block that can be successfully decoded at the determined SNR. Decoding at a higher code rate still enables successful decoding of a codeword of a code that has the subset property disclosed herein. In other words, given sufficient SNR, decoding a codeword using a higher code rate than used by an encoder results in decoding of encoded data, appended by a bitstream that includes one or more extra, known bits. The number of extra bits depends on the code rate mismatch.

Although measured or estimated SNR is used in blind detection of a code rate for decoding in an embodiment, the code rate for decoding could be blindly detected based on other criteria, such as a maximum or average SNR based on a history of transmissions received from a particular transmitter. A receiver could instead blindly select a code rate to decode a received word, determine whether decoding at that code rate was successful by running a CRC check for example, and then attempt decoding at a lower code rate in response to determining that the decoding at the blindly selected code rate was unsuccessful. This cycle could be repeated at one or more lower code rates, for a certain number of times or until a minimum code rate is reached, for example, before declaring a decoding error or performing other fault or failure processing such as requesting retransmission. Standard binary search algorithms could be applied.

In the case of a rate mismatch, an information bit block that is decoded by decoding the received word using the blindly detected code rate includes one or more extra bits following the decoded information bits. The extra bits are frozen bits in examples described above. A decoder may determine whether there are one or more extra bits, and discard the extra bit(s) at 508 in response to a positive determination. The one or more extra bits could be used in determining the code rate that was actually used to encode the codeword. In a rate-mismatching scenario, the blindly detected code rate does not match the encoding code rate. In some embodiments, the number of decoded information bits and thus the encoding code rate are determined. Such a determination could be made based on the number of extra bits that follow the decoded information bits, and the determined encoding code rate could be stored to enable blind selection of a code rate for decoding of subsequent received words based on a history of encoding code rates used by a particular transmitter, for example.

In an embodiment, CRC codes are embedded at one of multiple points in a codeword, and a CRC check is performed to determine where the codeword ends. The position of the last successful CRC indicates the end of the codeword, and the presence and number of extra bits in a decoded information block can then be determined. Frozen bits or other types of extra bits could be included in the CRC calculation, in which case the CRC automatically includes code rate adaptation. In this case the actual payload size of a received transmission block could be taken from overhead information such as Media Access Control (MAC) headers, for example. In another embodiment, the CRC check is performed at each of a number of possible code rates until it passes.

In some embodiments, the extra bits have a predetermined pattern or a predetermined value such as zero for frozen bits. A search could be performed to determine where in a decoded information bit block the extra bits start, and thus where decoded information bits end. Such a search could be a forward search or a backward search to determine the start point of the extra bits. Codeword length, payload length, or other information indicating the length of a code could be encoded into a codeword, at the beginning of the codeword for example, and the presence and number of any extra bits could be determined based on such encoded information. Such information would typically be located in higher layer protocol fields such as MAC headers, for example.

In summary, as the code rate for a polar code decreases, more and more information bits become fixed bits. This means that if a code rate for decoding is blindly detected to be higher than the actual encoding code rate, for example the transmitted code rate is ⅓ but the decoder blindly detects ½, then the frozen bits are decoded as if they were information bits. Given the decoded frozen bits and information bits, the actual code rate can then be detected, by performing a CRC iteration with checks at multiple points, for example. In an embodiment, a receiver estimates SNR and then decodes received data using one or more code rates that should be decodable near that SNR. In a CRC-based embodiment, if the CRC passes for one of the code rates, then the data has been blindly decoded. If the CRC does not pass, then based on the SNR estimate it is unlikely that decoding will be successful for higher coder rates, and a decoding failure could be declared, to initiate failure processing for example.

Blind detection of code rate could be applicable on a control channel such as PDCCH. As noted above, a UE could decode several different combinations of communication resources and code rates, and the application of blind code rate detection as disclosed herein could reduce the time and processing cost of such blind decoding. In an embodiment, a UE decodes many, 60 or more for example, different combinations of resources (tones) and code rates. The receiving at 502 could therefore involve receiving on a control channel, and possibly in different communication resources. Multiple code rates could be blindly detected at 504 and used in decoding at 506. The different code rates could correspond to different types/formats of grants, such as uplink (UL) or downlink (DL) grants for instance. The UE could then check the CRC for each of the different code rates, and if any of the CRCs pass, then the UE processes that grant.

More generally, a UE could be configured to decode several TBSs for a particular set of communication resources, with the different TBSs respectively corresponding to different message types. The UE could decode/check several or all of the TBSs simultaneously.

Figure 6:
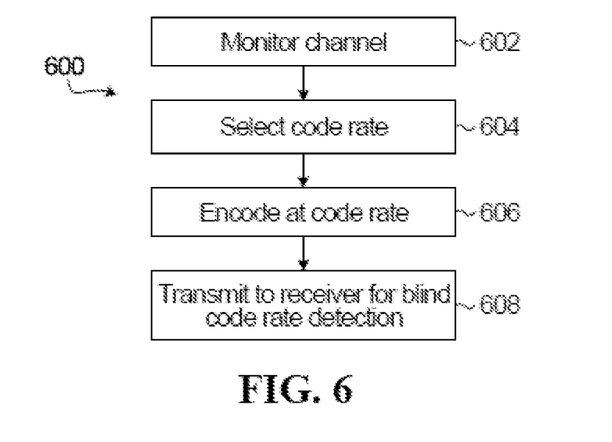
FIG. 6 is a flow diagram of an example encoding method according to another embodiment.

FIG. 6 is a flow diagram of an example encoding method according to another embodiment. The example encoding method 600 includes an optional operation of monitoring a communication channel at 602. In an embodiment, an encoding code rate for encoding information is selected based on communication channel conditions at a receiver to which the information is to be transmitted after encoding. Those communication channel conditions could be monitored at 602 based on channel quality feedback from the receiver, for example. In other embodiments, encoding code rate selection could also or instead be based on other criteria, and therefore channel monitoring at 602 is optional.

Encoding code rate selection could also or instead be based on encoding history, such as code rates that have previously been used in encoding information for the particular receiver to which the encoded information is to be transmitted. Decoding error history, such as whether a transmitter has had to retransmit previously when using higher than a certain code rate for information that was transmitted to the receiver, could also or instead be taken into account in selection of an encoding code rate. Channel monitoring at 602 is therefore an illustrative example of an operation to collect or consult information based upon which an encoding code rate could be selected.

Based on one or more criteria, an encoding code rate is selected at 604, from a range of code rates over which a code has an incremental shortening property. The information is encoded at 606 using the code and the selected encoding code rate, and transmitted to a receiver at 608. The encoded information is transmitted at 608 without explicit signaling of the selected encoding code rate, for blind detection of a decoding code rate at the receiver for decoding the encoded information.

In a variant of the example shown in FIG. 6, another method includes selecting, from a range of code rates, an encoding code rate for encoding information using a code which has an incremental shortening property over the range of code rates, encoding the information using the code and the selected encoding code rate, and transmitting the encoded information, without explicit signaling of the selected encoding code rate, for blind detection of a decoding code rate within the range of code rates by a receiver for decoding the encoded information. In one embodiment, the selecting includes selecting the encoding code rate based on communication channel conditions at the receiver. In another embodiment, the selecting includes selecting the encoding code rate based on encoding history. In yet another embodiment, the selecting includes selecting the encoding code rate based on decoding error history. Non-transitory processor-readable medium storing instructions which, when executed by one or more processor may be configured to cause the processors to perform the above method embodiments. Similarly, an apparatus including a transmitter and an encoder, operatively coupled to the transmitter, may be configured to perform any of the method embodiments described above.

As noted above, a UE could be configured to decode several TBSs for a particular set of communication resources, with the different TBSs respectively corresponding to different message types. Therefore, in an embodiment, several code rates could be selected at 604 and used for encoding the different TBSs at 606 for transmission in different communication resources at 608. Different combinations of communication resources and TBSs/code rates could be used on a control channel such as PDCCH for different types of grants, for example.

The example methods 500, 600 are intended for illustrative purposes. Other embodiments could involve performing the illustrates operations in any of various ways, performing fewer or additional operations, and/or varying the order in which operations are performed. Other variations could be or become apparent to a skilled person based on the present disclosure.

The embodiments described with reference to FIGS. 5 and 6 relate to example methods. Apparatus embodiments, for decoding and/or encoding, are also contemplated.

Figure 7:
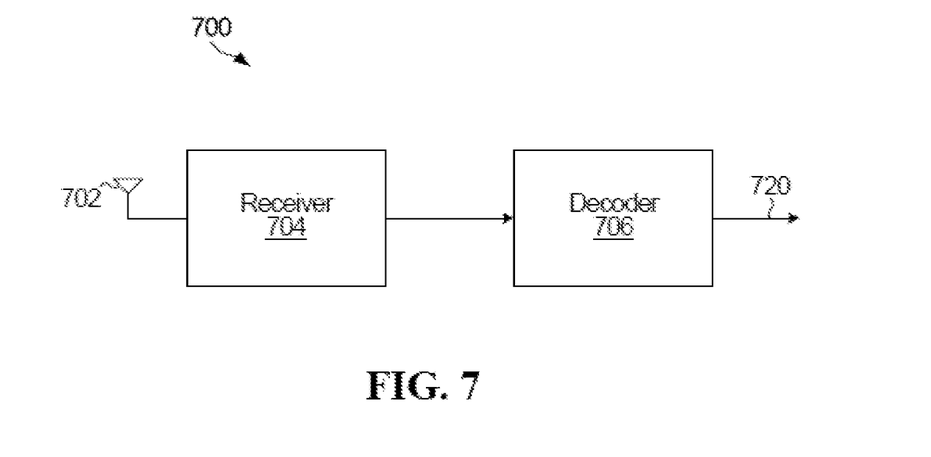
FIG. 7 is a block diagram of an example apparatus for receiving and decoding codewords.

FIG. 7 is a block diagram of an example apparatus for receiving and decoding codewords. The apparatus 700 includes a receiver 704 coupled to an antenna 702 for receiving signals from a wireless channel, and a decoder 706. In some embodiments, the receiver 704 includes a demodulator, an amplifier, and/or other components of an RF receive chain. The receiver 704 receives, via the antenna 702, a word that is based on a codeword of a code having the incremental shortening property over a range of code rates. Decoded bits are output at 720 for further receive processing.

The decoder 706 is implemented in circuitry, such as a processor, that is configured to estimate bits in the received word as disclosed herein. In a processor-based implementation of the decoder 706, processor-executable instructions to configure a processor to perform decoding operations are stored in a non-transitory processor-readable medium. The non-transitory medium could include one or more solid-state memory devices and/or memory devices with movable and possibly removable storage media. In yet another embodiment, the functionality of the receiver 704 and decoder 706 described herein may be fully or partially implemented in software or modules, for example in receiving and decoding modules stored in a memory and executed by a processor of the apparatus 700.

The decoder 706 is configured to perform a blind detection of a decoding code rate to be used in decoding the received word. The decoding code rate is within the range of code rates over which the code exhibits the incremental shortening property. The decoder 706 is further configured to decode the received word using the blindly detected code rate.

The decoder 706 could implement any of various other features that are disclosed herein, such as those described above with reference to FIG. 5. For example, the decoder 706 could be configured to perform the blind detection by determining an SNR of the received word, and determining the decoding code rate, based on the determined SNR, the to be used in decoding the received word. The decoder 706 could be configured to measure or otherwise determine the SNR. In another embodiment, the receiver 704 or another component of a communication device in which the apparatus 700 is implemented measures or determines the SNR and provides SNR information to the decoder 706. The decoder 706 could thus determine the SNR itself, or determine the SNR in conjunction with another component. The decoder 706 could also or instead consult history information in a memory, to detect a decoding code rate based on a history of code rates that successfully decoded words that were previously received from the same transmitter and/or a history of received SNR for words previously received from the transmitter.

The blind code rate detection by the decoder 706 could be iterative, with the decoder being configured to perform the blind detection by blindly selecting a first code rate, determine whether the decoding at the first code rate was successful, decode the received word using a second code rate lower than the first code rate in response to determining that the decoding at the first code rate was not successful.

Another decoder feature that could be provided in some embodiments relates to determining whether an information bit block decoded by decoding the received word using the blindly detected code rate is followed by one or more extra bits. This determination could be made based on performing a CRC check, for example. The decoder 706 could be further configured to discard the one or more extra bits. In some embodiments, the decoder 706 could be configured to also or instead determine, based on the one or more extra bits, an encoding code rate that was used to encode the codeword.

Figure 8:
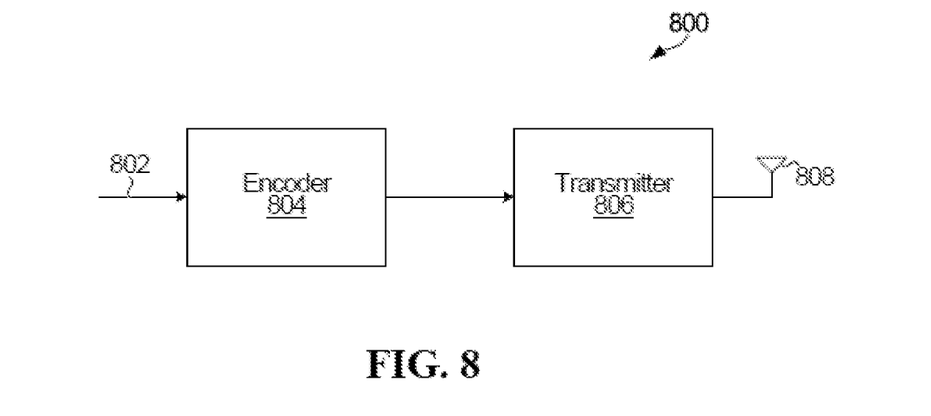
FIG. 8 is a block diagram of an apparatus for encoding and transmitting codewords.

FIG. 8 is a block diagram of an apparatus for encoding and transmitting codewords. The apparatus 800 includes an encoder 804 coupled to a transmitter 806. The encoder 804 is implemented in circuitry that is configured to encode an input bit stream 802 using a code having the codeword subset property disclosed herein. In the illustrated embodiment, the apparatus 800 also includes an antenna 808, coupled to the transmitter 806, for transmitting signals over a wireless channel. In some embodiments, the transmitter 806 includes a modulator, an amplifier, and/or other components of an RF transmit chain.

In some embodiments, the apparatus 800, and similarly the apparatus 700 in FIG. 7 as noted above, include a non-transitory computer readable medium that includes instructions for execution by a processor to implement and/or control operation of the encoder 804 in FIG. 8, to implement and/or control operation of the decoder 706 in FIG. 7, and/or to otherwise control the execution of methods described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk. In yet other embodiments, the functionality of the encoder 804 and transmitter 806 described herein may be fully or partially implemented in software or modules, for example in encoding and transmitting modules stored in a memory and executed by a processor of the apparatus 800.

The encoder 806 is configured to select an encoding code rate for encoding information. The encoding code rate is selected from a range of code rates over which a code has the incremental shortening property disclosed herein. The encoder 806 is further configured to encode the information using the code and the selected encoding code rate, and to transmit the encoded information via the transmitter 806 and the antenna 808 in the example shown. This transmission of the encoded information is made without explicit signaling of the selected encoding code rate. Blind detection of a decoding code rate for decoding the encoded information is performed at a receiver.

The encoder could be configured to select the encoding code rate based on one or more criteria, such as communication channel conditions at the receiver, encoding history, and decoding error history. The decoder 706 could be configured to measure or otherwise determine the SNR. For example, the apparatus 800 could include a channel monitor to receive channel state or quality reports from the receiver or otherwise determine communication channel conditions at the receiver. The encoder 804 could also or instead consult encoding history information and/or decoding error history in a memory.

Communication equipment could include the apparatus 700, the apparatus 800, or both a transmitter and a receiver and both an encoder and a decoder. Such communication equipment could be user equipment or communication network equipment.

Figure 9:
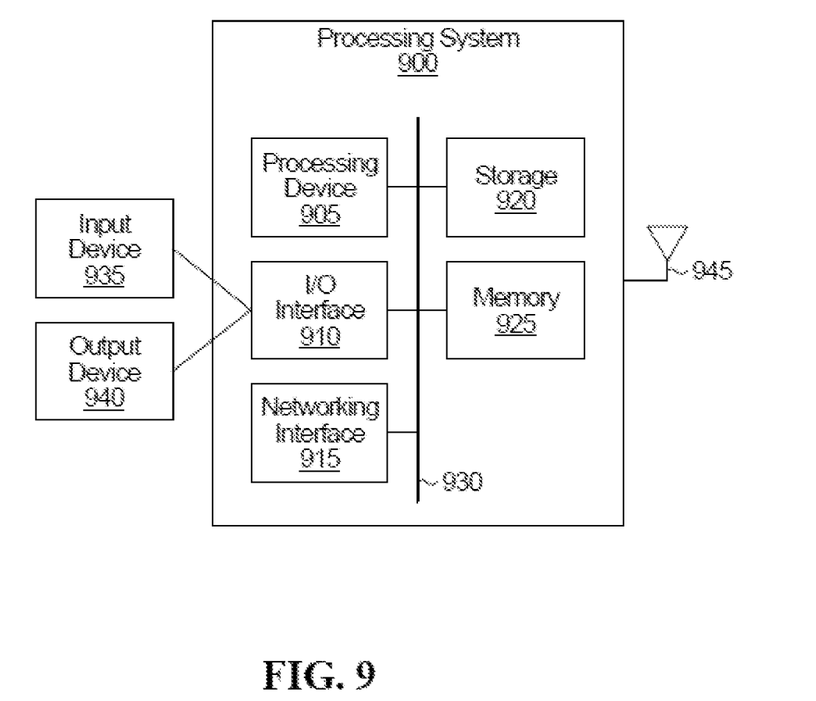
FIG. 9 is a block diagram of an example simplified processing system 400, which may be used to implement embodiments disclosed herein.

FIGS. 7 and 8 are generalized block diagrams of apparatus that could be used to implement blind code rate detection and decoding, and encoding of information for decoding by blind code rate detection. FIG. 9 is a block diagram of an example simplified processing system 900, which may be used to implement embodiments disclosed herein, and provides a higher level implementation example. The apparatus 700, the apparatus 800, or both, may be implemented using the example processing system 900, or variations of the processing system 900. The processing system 900 could be a server or a mobile device, for example, or any suitable processing system. Other processing systems suitable for implementing embodiments described in the present disclosure may be used, which may include components different from those discussed below. Although FIG. 9 shows a single instance of each component, there may be multiple instances of each component in the processing system 900.

The processing system 900 may include one or more processing devices 905, such as a processor, a microprocessor, an application-specific integrated circuit (ASIC), a field-programmable gate array (FPGA), a dedicated logic circuitry, or combinations thereof. The processing system 900 may also include one or more input/output (I/O) interfaces 910, which may enable interfacing with one or more appropriate input devices 935 and/or output devices 940. The processing system 900 may include one or more network interfaces 915 for wired or wireless communication with a network (e.g., an intranet, the Internet, a P2P network, a WAN and/or a LAN) or other node. The network interfaces 915 may include wired links (e.g., Ethernet cable) and/or wireless links (e.g., one or more antennas) for intra-network and/or inter-network communications. The network interfaces 915 may provide wireless communication via one or more transmitters or transmit antennas and one or more receivers or receive antennas, for example. In this example, a single antenna 945 is shown, which may serve as both transmitter and receiver. However, in other examples there may be separate antennas for transmitting and receiving. The processing system 900 may also include one or more storage units 920, which may include a mass storage unit such as a solid state drive, a hard disk drive, a magnetic disk drive and/or an optical disk drive.

The processing system 900 may include one or more memories 925, which may include a volatile or non-volatile memory (e.g., a flash memory, a random access memory (RAM), and/or a read-only memory (ROM)). The non-transitory memories 925 may store instructions for execution by the processing devices 905, such as to carry out examples described in the present disclosure. The memories 925 may include other software instructions, such as for implementing an operating system and other applications/functions. In some examples, one or more data sets and/or modules may be provided by an external memory (e.g., an external drive in wired or wireless communication with the processing system 900) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 930 providing communication among components of the processing system 900. The bus 930 may be any suitable bus architecture including, for example, a memory bus, a peripheral bus or a video bus. In FIG. 9, the input devices 935 (e.g., a keyboard, a mouse, a microphone, a touchscreen, and/or a keypad) and output devices 940 (e.g., a display, a speaker and/or a printer) are shown as external to the processing system 900. In other examples, one or more of the input devices 935 and/or the output devices 940 may be included as a component of the processing system 900.

The previous description of some embodiments is provided to enable any person skilled in the art to make or use an apparatus, method, or processor readable medium according to the present disclosure, to use a code with the subset decoding property, over a channel without a priori configured or explicitly signaled code rate. An appropriate code rate for decoding (and/or the code rate that was used in encoding) could be estimated, using a combination of semi-static configuration and current payload size, for example.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although polar codes are discussed in detail herein, embodiments may also or instead be implemented in conjunction with LDPC codes, where information bits are fixed, or with other types of codes that use frozen, fixed, padded, or otherwise known bits.

What is claimed is:

1. A method comprising:
receiving, by a wireless receiving device, a word that is based on a codeword of a polar or Low Density Parity Check (LDPC) code, the polar or LDPC code having an incremental shortening property over a range of code rates such that an information bit frozen to a value for a code rate is also frozen to the same value for lower code rates;
performing, by the wireless receiving device, a blind detection of a code rate within the range of code rates of the polar or LDPC code; and
decoding, by the wireless receiving device, the received word using the blindly detected code rate.

2. The method of claim 1, wherein performing a blind detection comprises:
determining a Signal to Noise Ratio (SNR) of the received word; and
determining, based on the determined SNR, the code rate to be used in decoding the received word.

3. The method of claim 2, wherein determining the code rate comprises determining a code rate associated with a longest block of information bits that can be successfully decoded from the received word at the determined SNR.

4. The method of claim 1, wherein performing the blind detection comprises blindly selecting a first code rate, and wherein the method further comprises:
determining whether the decoding at the first code rate was successful; and
decoding the received word using a second code rate lower than the first code rate in response to determining that the decoding at the first code rate was not successful.

5. The method of claim 1, further comprising:
determining whether an information bit block decoded by decoding the received word using the blindly detected code rate is followed by one or more extra bits.

6. The method of claim 5, further comprising:
discarding the one or more extra bits in response to determining that the information bit block decoded by decoding the received word using the blindly detected code rate is followed by the one or more extra bits.

7. The method of claim 5, further comprising:
determining, based on the one or more extra bits, the code rate within the range of code rates of the polar or LDPC code in response to determining that the information bit block is followed by the one or more extra bits.

8. The method of claim 5, wherein determining whether the information bit block is followed by the one or more extra bits comprises performing a Cyclic Redundancy Check (CRC).

9. The method of claim 1:
wherein the receiving comprises receiving on a control channel;
wherein the performing comprises blind detection of a plurality of code rates within the range of code rates of the polar or LDPC code; and
wherein the decoding comprises decoding using each code rate of the plurality of blindly detected code rates.

10. The method of claim 9, wherein the receiving comprises receiving in respective different communication resources.

11. The method of claim 9, wherein the plurality of blindly detected code rates correspond to different types of messages.

12. The method of claim 9, wherein the control channel is a Physical Downlink Control Channel (PDCCH).

13. A non-transitory processor-readable medium storing instructions which, when executed by one or more processors, cause the one or more processors to perform a method comprising:
receiving a word that is based on a codeword of a polar or Low Density Parity Check (LDPC) code, the polar or LDPC code having an incremental shortening property over a range of code rates such that an information bit frozen to a value for a code rate is also frozen to the same value for lower code rates;
performing a blind detection of a code rate within the range of code rates of the polar or LDPC code, to be used in decoding the received word; and
decoding the received word using the blindly detected code rate.

14. An apparatus comprising:
a wireless receiver configured to receive a word that is based on a codeword of a polar or Low Density Parity Check (LDPC) code, the polar or LDPC code having an incremental shortening property over a range of code rates of the polar or LDPC code such that an information bit frozen to a value for a code rate is also frozen to the same value for lower code rates; and
a decoder, operatively coupled to the wireless receiver, configured to:
perform a blind detection of a code rate within the range of code rates of the polar or LDPC code; and
decode the received word using the blindly detected code rate.

15. The apparatus of claim 14, wherein the decoder is configured to perform the blind detection by determining a Signal to Noise Ratio (SNR) of the received word, and determine, based on the determined SNR, the code rate to be used in decoding the received word.

16. The apparatus of claim 14, wherein the decoder is configured to determine the code rate by determining a code rate associated with a longest block of information bits that can be successfully decoded from the received word at the determined SNR.

17. The apparatus of claim 14, wherein the decoder is configured to:
perform the blind detection by blindly selecting a first code rate,
determine whether the decoding at the first code rate was successful; and
decode the received word using a second code rate lower than the first code rate in response to determining that the decoding at the first code rate was not successful.

18. The apparatus of any one of claim 14, wherein the decoder is further configured to determine whether an information bit block decoded by decoding the received word using the blindly detected code rate is followed by one or more extra bits.

19. The apparatus of claim 18, wherein the decoder is further configured to discard the one or more extra bits in response to determining that the information bit block is followed by the one or more extra bits.

20. The apparatus of claim 18, wherein the decoder is further configured to determine, based on the one or more extra bits, the code rate within the range of code rates of the polar or LDPC code in response to determining that the information bit block is followed by the one or more extra bits.

21. The apparatus of claim 18, wherein the decoder is configured to determine whether the information block is followed by the one or more extra bits performing a Cyclic Redundancy Check (CRC).

22. The apparatus of claim 14:
wherein the wireless receiver is configured to receive on a control channel; and
wherein the decoder is configured to perform blind detection of a plurality of code rates within the range of code rates, and to decode using each code rate of the plurality of blindly detected code rates.

23. The apparatus of claim 22, wherein the wireless receiver is configured to receive in respective different communication resources.

24. The apparatus of claim 22, wherein the plurality of blindly detected code rates correspond to different types of messages.

25. The apparatus of claim 22, wherein the control channel is a Physical Downlink Control Channel (PDCCH).

26. The apparatus of claim 14, wherein the apparatus is a user equipment.

27. The apparatus of claim 14, wherein the apparatus is a communication network equipment.

* * * * *